US009979368B1

(12) United States Patent
Yang et al.

(10) Patent No.: US 9,979,368 B1
(45) Date of Patent: May 22, 2018

(54) METHOD FOR AUTOMATICALLY LOWERING A PLAYING VOLUME AND ELECTRONIC DEVICE PERFORMING THE SAME

(71) Applicant: Unlimiter MFA Co., Ltd., Eden Island (SC)

(72) Inventors: Kuo-Ping Yang, Taipei (TW); Neo Bob Chih-Yung Young, Taipei (TW); Kuan-Li Chao, Taipei (TW); Chih-Long Chang, Taipei (TW); Wei-Lin Chang, Taipei (TW); Hsiang-Chun Ko, Taipei (TW)

(73) Assignee: UNLIMITER MFA CO., LTD, Eden Island (SC)

( * ) Notice: Subject to any disclaimer, the term of this patent is extended or adjusted under 35 U.S.C. 154(b) by 0 days. days.

(21) Appl. No.: 15/723,267

(22) Filed: Oct. 3, 2017

(30) Foreign Application Priority Data

Apr. 19, 2017 (TW) .............................. 106113169 A

(51) Int. Cl.
*H03G 3/00* (2006.01)
*H03G 3/20* (2006.01)
*H03G 3/32* (2006.01)
*H04R 3/00* (2006.01)

(52) U.S. Cl.
CPC ................. *H03G 3/32* (2013.01); *H04R 3/00* (2013.01); *H04R 2430/01* (2013.01)

(58) Field of Classification Search
CPC .................................... H03G 3/32; H04R 3/00
USPC .............................. 381/56, 58, 104, 106, 107
See application file for complete search history.

(56) References Cited

U.S. PATENT DOCUMENTS

| 4,381,488 | A  | * | 4/1983  | Fricke ..................... H03G 7/004 333/14 |
| 6,760,635 | B1 | * | 7/2004  | Bates ...................... H03G 3/001 381/103 |
| 9,571,054 | B2 | * | 2/2017  | Dinunzio ................. H03G 3/04 |
| 9,571,628 | B1 | * | 2/2017  | Bostick ............. H04M 1/72569 |
| 9,820,070 | B2 | * | 11/2017 | Takenouchi ......... H04R 29/004 |
| 9,870,782 | B2 | * | 1/2018  | Bostick ................ G10L 21/034 |
| 2005/0221868 | A1 | * | 10/2005 | Childress ............... H03G 3/342 455/569.2 |
| 2011/0051016 | A1 | * | 3/2011  | Malode .................... H03G 1/02 348/734 |
| 2014/0185830 | A1 | * | 7/2014  | Avrahami ............ H03G 3/3005 381/107 |

(Continued)

FOREIGN PATENT DOCUMENTS

TW            M533386 U      12/2016

*Primary Examiner* — Khai N Nguyen
(74) *Attorney, Agent, or Firm* — Bacon & Thomas, PLLC

(57) ABSTRACT

A method for automatically lowering the playing volume is disclosed. The method includes the following steps of: obtaining a first value according to a first playing volume and a first accumulated playing time of a sound player; determining whether the first value reaches a first threshold value; if yes, then lowering the first playing volume of the sound player to a second playing volume; obtaining a second value according to the second playing volume and a second accumulated playing time of the sound player; determining whether the second value reaches a second threshold value; if yes, then lowering the second playing volume of the sound player again, wherein the second threshold value is less than the first threshold value.

20 Claims, 4 Drawing Sheets

(56) References Cited

U.S. PATENT DOCUMENTS

| | | | | |
|---|---|---|---|---|
| 2014/0240595 A1* | 8/2014 | Dinunzio | ............... | H03G 3/04 |
| | | | | 348/484 |
| 2016/0381480 A1* | 12/2016 | Takenouchi | ......... | H04R 29/004 |
| | | | | 381/58 |
| 2017/0126192 A1* | 5/2017 | Fu | ........................ | H03G 3/32 |
| 2017/0140773 A1* | 5/2017 | Bostick | ............... | G10L 21/034 |

* cited by examiner

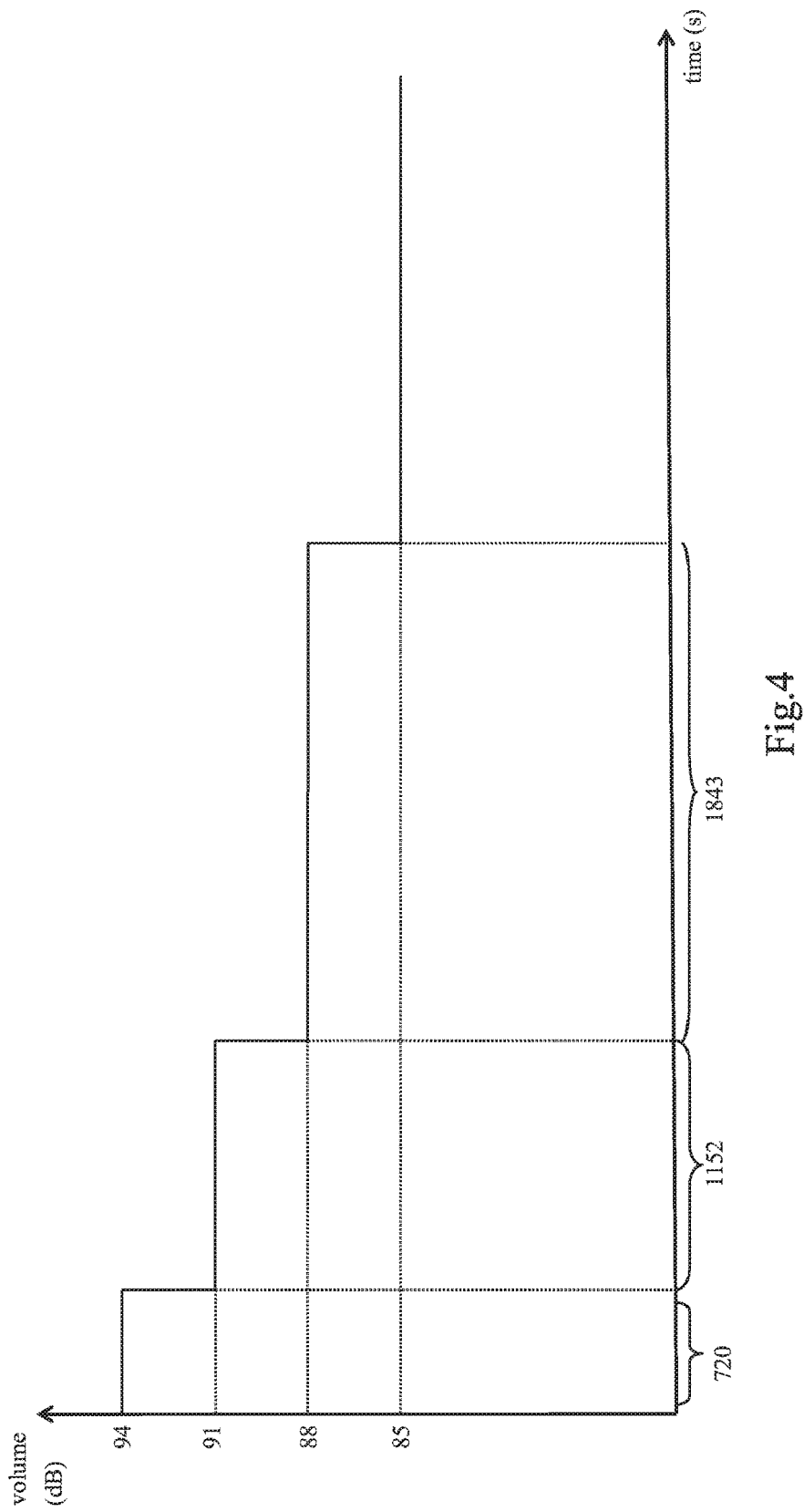

METHOD FOR AUTOMATICALLY LOWERING A PLAYING VOLUME AND ELECTRONIC DEVICE PERFORMING THE SAME

BACKGROUND OF THE INVENTION

1. Field of the Invention

The present invention relates to a method for adjusting an output volume and an electronic device thereof, and more particularly, to a method for automatically lowering a playing volume and an electronic device thereof.

2. Description of the Related Art

With the wide adoption of handheld electronic products, people tend to use these electronic products for long hours, especially to listen to music or to watch movies. However, prolonged exposure of the ear to a high-volume environment is likely to cause hearing loss.

According to the World Health Organization, continuous exposure to volume levels of 85 dB for 8 hours or 100 dB volume for 15 minutes may cause temporary hearing loss or tinnitus; in other words, the higher the volume becomes, the shorter the time for which the ears can endure it. When the ears are exposed to an extremely high sound volume, or the ears are exposed to a high-volume environment for too long, permanent damage to the auditory cells in the ear may result.

Therefore, it is necessary to propose a hearing protection means for controlling the playing time of an electronic device outputting different playing volumes.

SUMMARY OF THE INVENTION

It is an object of the present invention to provide a method for automatically lowering the playing volume of an electronic device and an electronic device thereof.

In order to achieve the above object, the present invention discloses a method for automatically lowering the playing volume of an electronic device, which is applicable in an electronic device comprising a sound player, the method comprising the following steps of: obtaining a first value according to a first playing volume and a first accumulated playing time of a sound player; determining whether the first value reaches a first threshold value; if yes, then lowering the first playing volume of the sound player by n decibels (dB), wherein $1 \leq n \leq 10$, and going to the steps of: obtaining a second value according to a second playing volume and a second accumulated playing time of the sound player, and determining whether the second value reaches a second threshold value; if yes, then lowering the second playing volume of the sound player by m dB, wherein $0.5 \leq m \leq 10$, and the second threshold value is less than the first threshold value.

The present invention further discloses an electronic device for automatically lowering the playing volume comprising a sound player and a processing unit. The sound player is provided for playing sound. The processing unit is electrically connected with the sound player, and the processing unit comprises a calculating and measuring module and a control module. The calculating and measuring module obtains a first value according to a first playing volume and a first accumulated playing time of the sound player. The control module determines whether the first value reaches a first threshold value; if yes, then the control module lowers the first playing volume of the sound player by n decibels (dB), wherein $1 \leq n \leq 10$. Thereafter, the calculating and measuring module obtains a second value according to a second playing volume and a second accumulated playing time of the sound player, and the control module determines whether the second value reaches a second threshold value; if yes, then the control module lowers the second playing volume of the sound player by m dB, wherein $0.5 \leq m \leq 10$, and the second threshold value is less than the first threshold value.

BRIEF DESCRIPTION OF THE DRAWINGS

FIG. 4 illustrates a relation between playing volume and listening time.

DETAILED DESCRIPTION OF THE PREFERRED EMBODIMENT

The advantages and innovative features of the invention will become more apparent from the following detailed description when taken in conjunction with the accompanying drawings.

Figure 1:
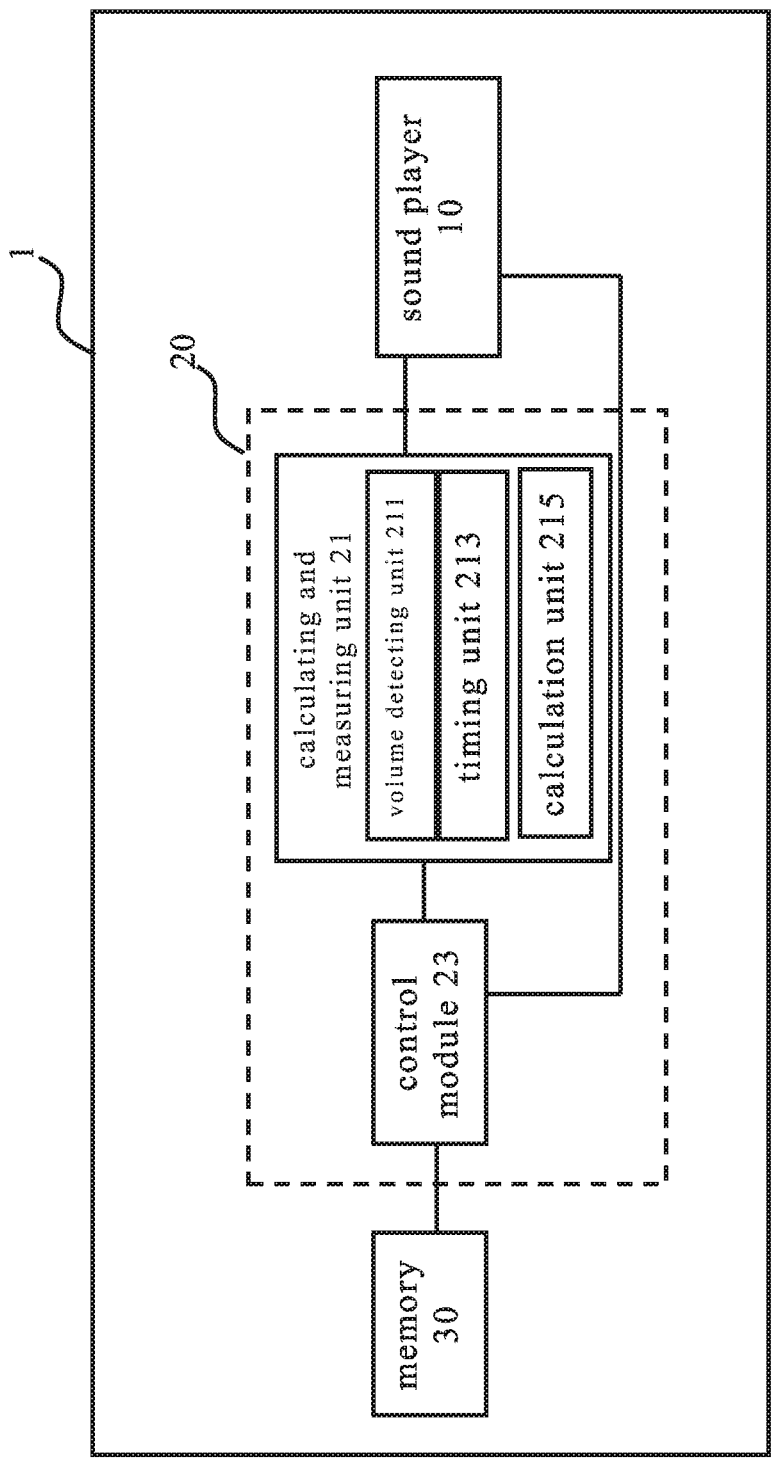
FIG. 1 illustrates a structural view of an electronic device of the present invention.

Please refer to FIG. 1 for a structural view of an electronic device of the present invention.

As shown in FIG. 1, in an embodiment of the present invention, the electronic device 1 for automatically lowering a playing volume comprises a sound player 10, a processing unit 20, and a memory 30.

In an embodiment of the present invention, the sound player 10 can be a speaker for playing sound.

In an embodiment of the present invention, the processing unit 20 is electrically connected with the sound player 10. The processing unit 20 comprises a calculating and measuring module 21 and a control module 23. It is noted that the above-described modules can be implemented in hardware devices, software programs, firmware, or a combination thereof, and they can also be configured as electrical circuits or other suitable forms; furthermore, each module can be implemented independently or can be combined with any other modules. In addition, the present embodiment is merely a preferred embodiment of the present invention, and for the sake of brevity, not all possible combinations and variations are described. However, it is known to those who are skilled in the art that the above-described modules or elements may not be necessary. For the purpose of the invention, it may also contain other well-known modules or elements. Each module or component may be omitted or modified as needed, and there may be any other modules or components between any two modules.

As shown in FIG. 1, in an embodiment of the present invention, the calculating and measuring module 21 comprises a volume detecting unit 211, a timing unit 213 and a calculation unit 215. The volume detecting unit 211 is provided for detecting a playing volume when the sound player 10 is playing. The timing unit 213 is provided for calculating an accumulated playing time of the sound player 10. The calculation unit 215 obtains a sound measurement value (hereinafter as value) according to the playing volume and accumulated playing time of the sound player 10.

Therefore, the calculating and measuring module 21 can obtain a value according to the playing volume and accumulated playing time of the sound player 10.

In an embodiment of the present invention, the calculating and measuring module 21 only counts the accumulated playing time of playing volume reaching 85 decibels (dB) to increase the value; in other words, when the playing volume is lower than 85, the value will not be increased. It is noted that the threshold volume is not limited to 85 db; it can be Q db, where 30≤Q≤85. In an embodiment of the present invention, for the same time period (such as one minute), the higher the playing volume is, the greater the value will be. The following table describes the accumulated time needed for increasing one unit of the value under different playing volumes.

| Playing volume | Accumulated playing time (unit: second) |
|---|---|
| 85 | 288 (s) |
| 86 | 228.6 (s) |
| 87 | 181.44 (s) |
| 88 | 144 (s) |
| 89 | 114.12 (s) |
| 90 | 90.72 (s) |
| 91 | 72 (s) |
| 92 | 57.24 (s) |
| 93 | 45.36 (s) |
| 94 | 36 (s) |
| 95 | 28.44 (s) |
| 96 | 22.68 (s) |
| 97 | 18 (s) |
| 98 | 14.40 (s) |
| 99 | 11.16 (s) |
| 100 | 9 (s) |

According to the table presented above, when the playing volume is higher, less time is required for the value to be increased. The calculating and measuring module 21 obtains the value (which comprises the first value, the second value, and the third value) according to the sum of the accumulated playing times of each playing volume. For example, suppose that the sound player 10 plays the sound at 85 dB for 2,880 seconds and 94 dB for 180 seconds; then the value will be 15 units (2880/288+180/36=15, for a total of 3,060 seconds, which reaches 15 units). As another example, suppose that the sound player 10 plays the sound at 94 dB for 180 seconds and 91 dB for 720 seconds; then the value will also be 15 units (180/36+720/72, but the value reaches 15 units in only 900 seconds). Furthermore, when the sound player 10 plays the sound at 91 dB for 720 seconds and 70 dB for 6,000 seconds, the 70 dB duration is not included in calculating the value because 70 dB is lower than 85 dB; therefore, the value will be 10 units (720/72=10).

In an embodiment of the present invention, the control module 23 is provided for determining whether the value reaches a threshold value and lowers the playing volume of the sound player 10 when the value reaches the threshold value.

In an embodiment of the present invention, the threshold value for determining whether to increase the value will be decreased according to the number of times the playing volume is lowered. More specifically, at first, the calculating and measuring module 21 obtains a first value according to a first playing volume and a first accumulated playing time of the sound player 10, and the control module 23 determines whether the obtained first value reaches a first threshold value; when the first value reaches the first threshold value, the control module 23 will lower the playing volume of the sound player 10 by n dB. Thereafter, the calculating and measuring module 21 obtains a second value according to a second playing volume and second accumulated playing time of the sound player 10, and the control module 23 determines whether the obtained second value reaches a second threshold value, wherein the second threshold value is lower than the first threshold value. When the second value reaches the second threshold value, the control module 23 will again lower the playing volume of the sound player 10 by m dB. Then after the playing volume is lowered, the calculating and measuring module 21 obtains a third value according to a third playing volume and third accumulated playing time of the sound player 10, and the control module 23 determines whether the obtained third value reaches a third threshold value, wherein the third threshold value is lower than the second threshold value. When the third value reaches the third threshold value, the control module 23 will again lower the playing volume of the sound player 10 by m dB.

In an preferred embodiment of the present invention, the values of n and m are both 3, but n can be any value from 1 to 10, and m can be any value from 0.5 to 10. Furthermore, the third threshold value is 80% of the second threshold value, and the second threshold value is 80% of the first threshold value. However, in the present invention, the third threshold value can be y % of the second threshold value, where 60≤y≤95; the second threshold value can be x % of the first threshold value, where 60≤x≤95.

In an embodiment of the present invention, the memory 30 is electrically connected with the processing unit 20, and the memory 30 is provided for storing data.

Figure 2:
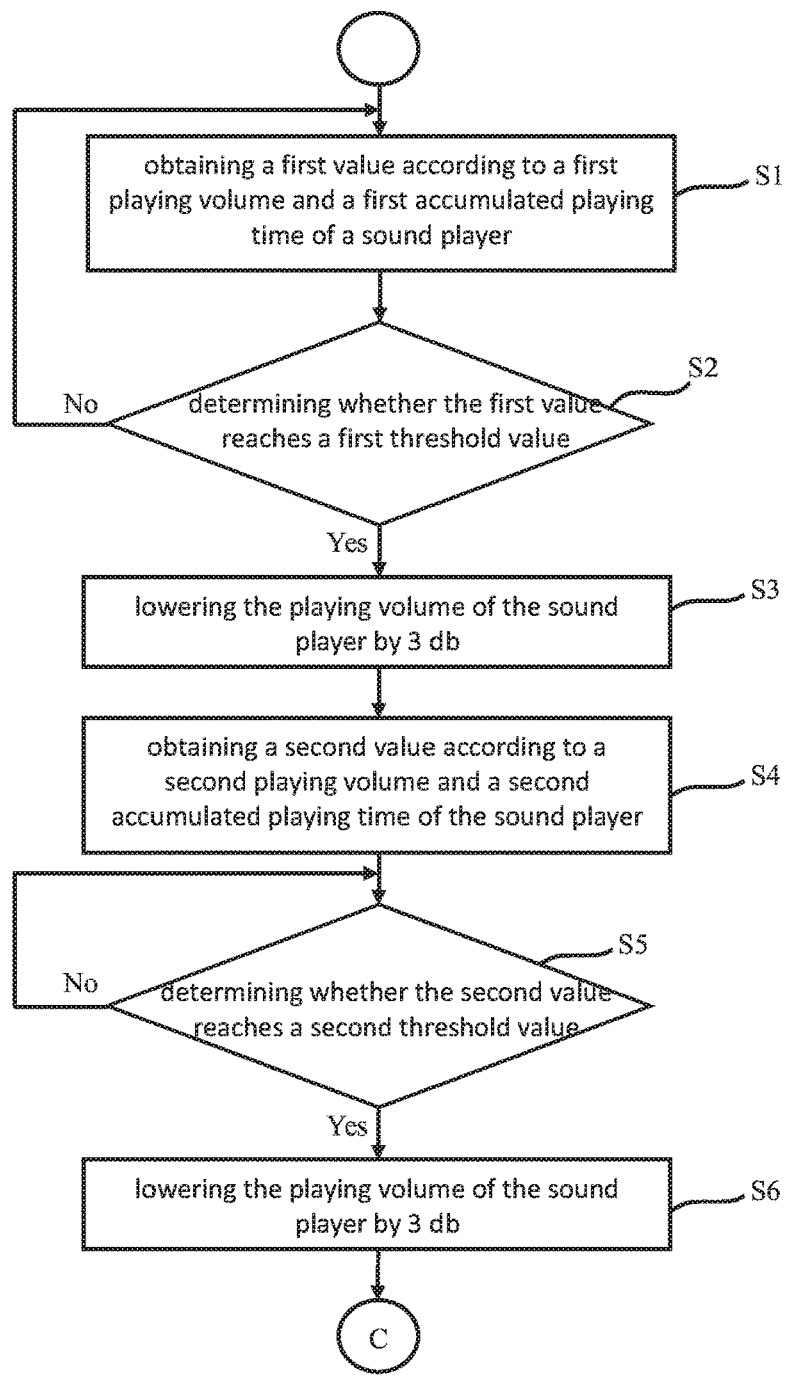
FIG. 2 illustrates a first flowchart of a method for automatically lowering a playing volume of the present invention.
Figure 3:
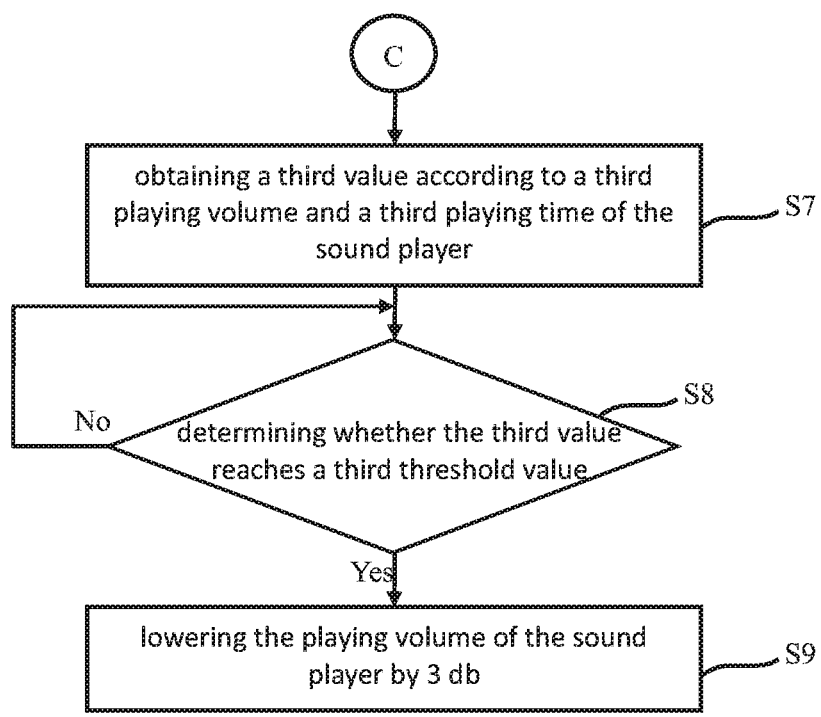
FIG. 3 illustrates a second flowchart of the method for automatically lowering a playing volume of the present invention.

Now please refer to FIG. 1 to 4, wherein FIG. 2 illustrates a first flowchart of a method for automatically lowering the playing volume of the present invention, and FIG. 3 illustrates a second flowchart of the method for automatically lowering the playing volume of the present invention. The steps of FIG. 2 and FIG. 3 are described with reference to FIG. 1 and FIG. 4. It is noted that although the method for automatically lowering the playing volume is described using the electronic device 1 for automatically lowering the playing volume, the method is not limited to application only in the electronic device 1.

First the method goes to step S1: obtaining a first value according to a first playing volume and a first accumulated playing time of a sound player.

In an embodiment of the present invention, the method for lowering the playing volume is applicable in the electronic device 1 shown in FIG. 1, and the method can automatically lower the playing volume of the sound player 10 according to the playing volume and the accumulated playing time of the sound player 10 of the electronic device 1. Therefore, the first step of the method is using the calculating and measuring module 21 of the processing unit 20 to obtain the first value according to the first playing volume and the first accumulated playing time of the sound player 10.

As shown in FIG. 4, suppose that in the beginning the first playing volume of the sound player 10 is 94 dB; according to the table presented above, the value increases one unit for every 36 seconds, so the first value will be 100(3600/36=100) if the accumulated playing time is 3,600 seconds.

The method goes to step S2: determining whether the first value reaches a first threshold value.

The calculating and measuring module 21 obtains the first value, and the control module 23 determines whether the first value reaches a first threshold value. In an embodiment of the present invention, the first threshold value can be 20 units or any other values.

Then the method goes to step S3: lowering the playing volume of the sound player by 3 db.

In an embodiment of the present invention, suppose that in step S2 the first value reaches the first threshold value; the control module 23 of the processing unit 20 will lower the playing volume of the sound player 10 by 3 db. As illustrated in FIG. 4, suppose that the first playing volume is 94 dB (in fact, the playing volume of the music should be constantly changing; however, for better understanding, the playing volume is set to a fixed value throughout the embodiment), and the first threshold value is set to 20; therefore, when the accumulated playing time of the sound player 10 playing at the first playing volume reaches 720 seconds, the control module 23 will lower the playing volume of the sound player 10 by 3 db.

Then the method goes to step S4: obtaining a second value according to a second playing volume and a second accumulated playing time of the sound player.

After lowering the playing volume, the calculating and measuring module 21 of the processing unit 20 obtains a second value according to a second playing volume and a second accumulated playing time of the sound player. As illustrated in FIG. 4, here the second playing volume is the lowered first playing volume, which is 91 dB.

Then the method goes to step S5: determining whether the second value reaches a second threshold value.

Similarly, the control module 23 of the processing unit 20 determines whether the obtained second value reaches a second threshold value. In an embodiment of the present invention, the second threshold value is 80% of the first threshold value; that is, the second threshold value is 16 units, which is lower than the first threshold value.

Then the method goes to step S6: lowering the playing volume of the sound player by 3 db.

In step S5, when the second value reaches the second threshold value, the control module 23 once again lowers the playing volume of the sound player 10 by 3 dB. As illustrated in FIG. 4, when the accumulated playing time of the sound player 10 playing at 91 dB reaches 1,152 seconds (72*16=1152), the control module 23 again lowers the playing volume of the sound player 10 by 3 dB, to 88 dB.

Then the method goes to step S7: obtaining a third value according to a third playing volume and a third playing time of the sound player.

After step S6 is done, the calculating and measuring module 21 of the processing unit 20 obtains a third value according to the third playing volume and the third playing time of the sound player 10.

Then the method goes to step S8: determining whether the third value reaches a third threshold value.

Similarly, after lowering the playing volume, the control module 23 determines whether the obtained third value reaches a third threshold value. In an embodiment of the present invention, the third threshold value is 80% of the second threshold value; that is, the third threshold value is 12.8 (16*80%=12.8) units, which is lower than the second threshold value.

The method then goes to step S9: lowering the playing volume of the sound player by 3 db.

In the step S8, when it is determined that the third value reaches the third threshold value, the control module 23 of the processing unit 20 once again lowers the playing volume of the sound player 10 by 3 dB. As illustrated in FIG. 4, when the accumulated playing time of the sound player 10 playing at 88 dB reaches 1,843 seconds (144*12.8=1843), the control module 23 once again lowers the playing volume of the sound player 10 by 3 dB, to 85 dB.

The above embodiment is only a simplified description of the present invention. When playing music, the sound volume may change greatly at each moment. The greater the sampling frequency is, the more accurate the calculation will be, but in such calculations consume more processor resources. In calculating the sound measurement values, for example, the average volume per second can be used as the playing volume, or the average volume for every five seconds can be used as the playing volume, but the present invention is not limited to these intervals.

It is noted that the above-mentioned embodiments are only for illustration. It is intended that the present invention cover modifications and variations of this invention provided they fall within the scope of the following claims and their equivalents. Therefore, it will be apparent to those skilled in the art that various modifications and variations can be made to the structure of the present invention without departing from the scope or spirit of the invention.

What is claimed is:

1. A method for automatically lowering the playing volume, which is applicable in an electronic device comprising a sound player, the method comprising the following steps of:
    obtaining a first value according to a first playing volume and a first accumulated playing time of the sound player;
    determining whether the first value reaches a first threshold value; if yes, then lowering the first playing volume of the sound player by n decibels (dB), wherein 1≤n≤10, and going to steps of:
    obtaining a second value according to a second playing volume and a second accumulated playing time of the sound player; and
    determining whether the second value reaches a second threshold value; if yes, then lowering the second playing volume of the sound player by m dB, wherein 0.5≤m≤10, and the second threshold value is less than the first threshold value.

2. The method as claimed in claim 1, wherein the second threshold value is x percent (%) of the first threshold value, where 60≤x≤95.

3. The method as claimed in claim 2, wherein the first value will not be increased when the first playing volume is lower than Q dB, and the second value will not be increased when the second playing volume is lower than Q dB, where 30≤Q≤85.

4. The method as claimed in claim 3, wherein when the first playing volume is higher than Q dB, the higher the first playing volume is, the more the first value will be increased, and the higher the second playing volume is, the more the second value will be increased.

5. The method as claimed in claim 1, wherein when the second value reaches the second threshold value, the method goes to steps of:
    obtaining a third value according to a third playing volume and a third playing time of the sound player; and
    determining whether the third value reaches a third threshold value; if yes, then lowering the second playing volume of the sound player by m dB, wherein 0.5≤m≤10, and the third threshold value is less than the second threshold value.

6. The method as claimed in claim 2, wherein when the second value reaches the second threshold value, the method goes to steps of:

obtaining a third value according to a third playing volume and a third playing time of the sound player; and determining whether the third value reaches a third threshold value; if yes, then lowering the second playing volume of the sound player by m dB, wherein 0.5≤m≤10, and the third threshold value is less than the second threshold value.

7. The method as claimed in claim 3, wherein when the second value reaches the second threshold value, the method goes to steps of:

obtaining a third value according to a third playing volume and a third playing time of the sound player; and determining whether the third value reaches a third threshold value; if yes, then lowering the second playing volume of the sound player by m dB, wherein 0.5≤m≤10, and the third threshold value is less than the second threshold value.

8. The method as claimed in claim 4, wherein when the second value reaches the second threshold value, the method goes to steps of:

obtaining a third value according to a third playing volume and a third playing time of the sound player; and determining whether the third value reaches a third threshold value; if yes, then lowering the second playing volume of the sound player by m dB, wherein 0.5≤m≤10, and the third threshold value is less than the second threshold value.

9. The method as claimed in claim 5, wherein the third threshold value is y % of the second threshold value, where 60≤y≤95.

10. The method as claimed in claim 8, wherein the third threshold value is y % of the second threshold value, where 60≤y≤95.

11. An electronic device for automatically lowering the playing volume comprising:

a sound player for playing sound; and a processing unit electrically connected with the sound player, the processing unit comprising:

a calculating and measuring module obtaining a first value according to a first playing volume and a first accumulated playing time of the sound player; and a control module determining whether the first value reaches a first threshold value; if yes, then lowering the first playing volume of the sound player by n decibels (dB), wherein 1≤n≤10; then the calculating and measuring module obtaining a second value according to a second playing volume and a second accumulated playing time of the sound player, and the control module determining whether the second value reaches a second threshold value; if yes, then lowering the second playing volume of the sound player by m dB, wherein 0.5≤m≤10, and the second threshold value is less than the first threshold value.

12. The electronic device as claimed in claim 11, wherein the second threshold value is x percent (%) of the first threshold value, where 60≤x≤95.

13. The electronic device as claimed in claim 12, wherein the first value will not be increased when the first playing volume is lower than Q dB, and the second value will not be increased when the second playing volume is lower than Q dB, where 30≤Q≤85.

14. The electronic device as claimed in claim 13, wherein when the first playing volume is higher than Q dB, the higher the first playing volume is, the more the first value will be increased, and the higher the second playing volume is, the more the second value will be increased.

15. The electronic device as claimed in claim 11, wherein when the second value reaches the second threshold value, the calculating and measuring module obtains a third value according to a third playing volume and a third playing time of the sound player, and the control module determines whether the third value reaches a third threshold value; if yes, then it lowers the third playing volume of the sound player by m dB, wherein 0.5≤m≤10, and the third threshold value is less than the second threshold value.

16. The electronic device as claimed in claim 12, wherein when the second value reaches the second threshold value, the calculating and measuring module obtains a third value according to a third playing volume and a third playing time of the sound player, and the control module determines whether the third value reaches a third threshold value; if yes, then it lowers the third playing volume of the sound player by m dB, wherein 0.5≤m≤10, and the third threshold value is less than the second threshold value.

17. The electronic device as claimed in claim 13, wherein when the second value reaches the second threshold value, the calculating and measuring module obtains a third value according to a third playing volume and a third playing time of the sound player, and the control module determines whether the third value reaches a third threshold value; if yes, then it lowers the third playing volume of the sound player by m dB, wherein 0.5≤m≤10, and the third threshold value is less than the second threshold value.

18. The electronic device as claimed in claim 14, wherein when the second value reaches the second threshold value, the calculating and measuring module obtains a third value according to a third playing volume and a third playing time of the sound player, and the control module determines whether the third value reaches a third threshold value; if yes, then it lowers the third playing volume of the sound player by m dB, wherein 0.5≤m≤10, and the third threshold value is less than the second threshold value.

19. The electronic device as claimed in claim 15, wherein the third threshold value is x percent (%) of the second threshold value, where 60≤x≤95.

20. The electronic device as claimed in claim 18, wherein the third threshold value is x percent (%) of the second threshold value, where 60≤x≤95.

* * * * *